US011602923B2

(12) United States Patent
Vavassori Bisutti et al.

(10) Patent No.: US 11,602,923 B2
(45) Date of Patent: Mar. 14, 2023

(54) TRANSFER SYSTEM FOR ELECTRONIC-TECHNOLOGY TEXTILE PRINTING

(71) Applicant: POLICROM SCREENS S.P.A., Bergamo (IT)

(72) Inventors: Giorgio Vavassori Bisutti, Bergamo (IT); Valentina Sabatini, Carvico (IT)

(73) Assignee: Policrom Screens S.p.A., Bergamo (IT)

( * ) Notice: Subject to any disclaimer, the term of this patent is extended or adjusted under 35 U.S.C. 154(b) by 512 days.

(21) Appl. No.: 16/348,529

(22) PCT Filed: Nov. 10, 2017

(86) PCT No.: PCT/IB2017/057038
§ 371 (c)(1),
(2) Date: May 9, 2019

(87) PCT Pub. No.: WO2018/092009
PCT Pub. Date: May 24, 2018

(65) Prior Publication Data
US 2019/0358938 A1 Nov. 28, 2019

(30) Foreign Application Priority Data
Nov. 15, 2016 (IT) .................. 102016000115345

(51) Int. Cl.
| | | |
|---|---|---|
| *B32B 27/08* | (2006.01) | |
| *B32B 27/28* | (2006.01) | |
| *D06Q 1/12* | (2006.01) | |
| B32B 27/36 | (2006.01) | |
| B41J 2/335 | (2006.01) | |
| B32B 27/40 | (2006.01) | |

(52) U.S. Cl.
CPC ............ *B32B 27/08* (2013.01); *B32B 27/285* (2013.01); *D06Q 1/12* (2013.01); *B32B 27/36* (2013.01); *B32B 27/40* (2013.01); *B32B 2255/10* (2013.01); *B32B 2255/20* (2013.01); *B32B 2255/26* (2013.01); *B32B 2307/30* (2013.01); *B41J 2/33535* (2013.01)

(58) Field of Classification Search
CPC ................................. B32B 27/08; B32B 27/28

USPC .......................................................... 428/35.7
See application file for complete search history.

(56) References Cited

U.S. PATENT DOCUMENTS

| | | | | |
|---|---|---|---|---|
| 7,947,361 | B2* | 5/2011 | Fukaya | ..................... C09J 7/40 428/220 |
| 2011/0236608 | A1* | 9/2011 | Vavassori Bisutti | ........................ B41M 5/0355 428/32.69 |
| 2015/0290910 | A1 | 10/2015 | Haller et al. | |
| 2017/0232709 | A1* | 8/2017 | Inubushi | ............... B32B 15/085 428/461 |
| 2018/0009202 | A1* | 1/2018 | Sasaki | ..................... B32B 27/36 |
| 2018/0015713 | A1* | 1/2018 | Inubushi | ................. B32B 27/10 |
| 2018/0022073 | A1* | 1/2018 | Sasaki | ..................... B32B 27/32 428/35.7 |
| 2018/0251278 | A1* | 9/2018 | Sasaki | ................... H01L 31/049 |
| 2019/0185697 | A1* | 6/2019 | Vavassori Bisutti | .. C09D 11/54 |
| 2019/0203063 | A1* | 7/2019 | Vavassori Bisutti | ........................ C09D 101/02 |

FOREIGN PATENT DOCUMENTS

| | | | |
|---|---|---|---|
| GB | 2419110 A | 4/2006 | |
| JP | 3593361 B2 | 11/2004 | |
| WO | 2008040992 A1 | 4/2008 | |
| WO | WO-2010123127 A1 * | 10/2010 | .......... B41M 5/5281 |
| WO | 2011027375 A1 | 3/2011 | |

OTHER PUBLICATIONS

Machine_English_translation_WO_2010123127_A1; Kawamura, M; Thermal Transfer Receiving Sheet; Oct. 28, 2010; EPO; whole document (Year: 2010).*
International Search Report in PCT/IB2017/057038 dated Feb. 9, 2018.
Written Opinion in in PCT/IB2017/057038 dated Feb. 9, 2018.

* cited by examiner

*Primary Examiner* — Tahseen Khan
(74) *Attorney, Agent, or Firm* — Manelli Selter PLLC; Edward Stemberger

(57) ABSTRACT

System with at least two layers as a mean or system for transferring electrically conductive ink adapted to receive and transfer said ink on a textile substrate by a thermal transfer.

4 Claims, No Drawings

TRANSFER SYSTEM FOR ELECTRONIC-TECHNOLOGY TEXTILE PRINTING

TECHNICAL FIELD OF THE INVENTION

The present invention concerns the implementation of an innovative double-layer polymer couple, a system with at least two layers according to the present invention, to be used as system for transferring and applying electronic components, printed both through silkscreen and through digital techniques and connected to hard electronic devices, on flexible and not flexible textile substrates; this innovative system consists of 1) an upper layer, a support layer according to the present invention, of a generic transparent, colourless polymer film, thermally pre-treated in such a way as to ensure a high level of reliability as regards its dimensional stability for the thermal application range concerned, in particular a support layer containing a polymer thermostabilized at a temperature not higher than 150° C. and with a dimensional variation not greater than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, the support layer being duly modified on both its surfaces through a chemical treatment aimed at changing the surface tension of the polymer film itself through an activation system containing an activating agent according to the present invention; 2) a lower layer implemented with a generic low-melting polyurethane film, in particular a low-melting polyurethane layer, having a melting temperature not higher than 150° C.

The layer of generic transparent, colourless polymer film, thermally and dimensionally pre-stabilized, in particular a support layer containing a polymer thermostabilized at a temperature not higher than 150° C. and with a dimensional variation not greater than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, the support layer being treated on both its surfaces with an activation system containing an activating agent, namely a chemical formulation containing an agent suitable to change its surface tension and hence its wettability, according to the present invention, makes it possible to accomplish on the external surface of the polymer film, or support layer, not in contact with the generic low-melting polyurethane film, or low-melting polyurethane layer having a melting temperature not higher than 150° C., both a) the printing of electrically conductive circuits through the deposition of inks implemented with organic and/or inorganic conductive materials printed with the usual silkscreen and digital inkjet techniques, and b) the connection of the latter with hard electronic devices for reading, processing data and transmitting data.

This treatment for modifying the surface properties of the used generic polymer film, the support layer, makes it possible, on the internal polymer surface of the polymer film, namely the internal surface of the support layer (in particular the support layer containing a polymer thermostabilized at a temperature not higher than 150° C. and with a dimensional variation not greater than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, the surfaces of the support layer having been treated with the activating agent) in contact with the generic low-melting polyurethane film, in particular low-melting polyurethane having a melting temperature not higher than 150° C., to achieve adherence, after heating the polyurethane film itself, between the polymer film printed with electric circuits and the low-melting polyurethane film. The generic low-melting polyurethane film, in particular low-melting polyurethane having a melting temperature not higher than 150° C., after heating will in its turn allow the conductive printed system applied above the polyurethane film through the polymer film carrier to adhere to a textile support, whether flexible or not flexible. The coupled system for transferring and applying electronically conductive components on flexible and not flexible textile supports makes it possible in a highly innovative manner to protect and maintain the ink electric conduction constant along the whole printed conductive track, in such a way that the printed inks are not affected by any charge interruption due to surface unevenness and to the chemical-physical properties of the substrate they are printed on; also, it allows clamping to be stable over time, with a high thermal and dimensional stability of the hard conductive components to the substrate they are applied to, mechanical stresses or aging of the surface treatments applied to the print substrates not impairing the conductive performances and the quality of the end device.

The system so implemented, which is the object of the present invention, allows electronic devices to be implemented on textile substrates, whether flexible or not flexible, and to be used in several application fields such as in electronic devices for measuring, processing and transmitting data, in the fashion field to achieve fashionable interactive and highly technological fabrics, in the medical field in order to manufacture devices for monitoring and transmitting real-time data relating to the health of an individual and the individual's sports performances, lastly as antishoplifting devices to be applied on clothing items.

STATE OF THE ART

A double-layer polymer coupled system has been developed over the years, the system having at least two layers according to the present invention, to be used as system for transferring and applying electronic components, printed both through silkscreen and through digital techniques and connected to hard electronic devices for measuring, processing and transmitting data, on flexible and not flexible textile substrates, consisting of a layer of a generic high-melting polyurethane film, with melting temperature of 120° C. or more, coupled with a layer of a generic low-melting polyurethane film, having a melting temperature within the thermal range of 60-120° C. Specifically, during the application step of assembling the device, silkscreen or digital printing of electrically conductive inks, implemented with highly electrically conductive organic and/or inorganic materials, is first accomplished on the external surface of the high-melting polyurethane layer, previously coupled by thermal action with the low-melting polyurethane layer, then the same are connected with hard devices for measuring, processing and transmitting data.

Once the geometric shape of interest of the material printed with the electric circuit has been cut by manual and/or digital etching, the electric component printed on the surface of the double-layer system consisting of high-melting polyurethane and low-melting polyurethane can be transferred through a hot-stamping press on a textile substrate, either flexible or not flexible.

The previous coupling of the high-melting polyurethane layer with the low-melting polyurethane layer favours the clamping of the electronic device to the textile substrate concerned, on account of the adhesive action of the low-melting polyurethane layer. The electric circuit implemented and transferred on a fabric as described above is then protected against external aggressive chemical and physical agents by a protective coating achieved by applying, above the electric circuit itself, either a further layer of a generic high-melting polyurethane film, previously coloured in an even manner throughout its surface and/or decorated with a further digital print, or by one or more direct silkscreen prints.

The problems associated to the above double-layer polymer system to be used as system for transferring and applying electronic components, printed both through silkscreen and through digital techniques, on flexible and not flexible textile substrates, consisting of a high-melting polyurethane layer coupled with a low-melting polyurethane layer, are manifold.

The main limit of this system rests in the elastic behaviour of both the layer of the generic high-melting polyurethane film on which the conductive components are printed and connected with the hard devices for data transmission and the layer of the generic low-melting polyurethane film with which the polyurethane printed with the electric circuits is coupled. The excessive elasticity of these two polyurethane layers entails the following three main thermal drawbacks:
1) the elasticity of the polyurethane layers and of the conductive circuits printed above them achieves under mechanical stress an elongation of 10% or more compared to the measurement of the elastic constant of the material itself. In relation with said variation of the elastic elongation of the polyurethane substrates, a strong decrease of the electric conductivity of the circuits printed above the polyurethane-based couple starts to show, since on account of the chemical-physical nature of the used conductive inks, the circuits do not have the same viscoelastic behaviour as the polymer couple. An irregular electric transmission of the printed conductive track entails an incorrect operation of the electronic device;
2) it is very difficult to ensure a clamping which is stable over time of hard electronic components on a flexible and elastic support such as the one made of polyurethane; as a matter of fact, the electronic components associated to the printed conductive tracks are as a rule structurally hard devices, which have conversely to be welded on a material having a flexible and elastic chemical-physical nature. The system thus implemented obviously shows structural weaknesses exactly corresponding to the physical point of interaction between the hard electronic component and the flexible substrate: any possible mechanical stress determines fractures or contact interruptions, which cause an alteration of the transmission of electric data and accordingly a failure of the end device;

3) a further critical aspect related to the use of the above polyurethane double-layer system relates to the low thermal and dimensional stability of the polyurethane components during the various steps of processing and assembling the end device, such as—coupling the polyurethane layers to each other, —printing and drying the electric circuits based on conductive inks printed above the polyurethane double-layer system, —applying and clamping the electric components to the conductive tracks of the polyurethane double-layer system, —transferring and adhering the end device to the flexible or hard textile substrate. Each of these technical steps involves the use of heating systems operating in an estimated thermal range between 100° C. and 140° C., at which temperatures the polyurethane films used in this system are liable to dimensional variations. The technical drawback which most frequently occurs when using this kind of system is the incorrect adjustment or alignment of the polyurethane layers to each other as well as of the connections between the electric circuits and the hard conductive components of the end device, as a result of a dimensional variation of the polyurethane layers forming the system described above.

A strong need therefore existed to overcome the above objective limits with the aim to develop a double-layer system consisting of a layer provided with clamping features to the flexible or not flexible textile substrate of the generic low-melting polyurethane and a layer which may ensure a constant electric transmission along the whole electric circuit, a steady engagement of the hard components of the end electronic device and a satisfactory thermal and dimensional stability based on the application requirements of the electric device.

SUMMARY OF THE INVENTION

The applicant, continuing research in the present technical field, has surprisingly and unexpectedly implemented an innovative double-layer polymer system, a system with at least two layers according to the present invention, between a generic transparent and colourless polymer film, a support layer according to the present invention, and a generic low-melting polyurethane film, a low-melting polyurethane layer according to the present invention, to be used as system for transferring and applying electronic components, printed both through silkscreen and through digital techniques and connected to hard electronic devices for measuring, processing and transmitting data, on flexible and not flexible textile substrates.

In particular, the applicants implemented an innovative dual-layer system, a system with at least two layers according to the present invention, comprising, preferably consisting of: 1) an upper layer, a support layer according to the present invention, of a generic transparent and colourless polymer film, thermally and dimensionally pre-treated in such a way as to ensure a high level of reliability as regards its dimensional stability and duly modified on both its surfaces through a treatment with an activation system, comprising an activating agent according to the present invention, aimed at changing the surface tension of the polymer film itself, the support layer according to the present invention, 2) a lower layer of a generic low-melting polyurethane film, in particular low-melting polyurethane having a melting temperature not higher than 150° C., having a melting temperature not higher than the one used for the dimensional thermostabilization of the polymer upper layer, a support layer according to the present invention, described above in point 1).

The object of the present invention is the use of a layer of a generic transparent and colourless, thermally and dimensionally pre-stabilized polymer film, the support layer according to the present invention, treated on both its surfaces with an activation system, comprising an activating agent according to the present invention, such as a chemical formulation, comprising an organic or inorganic solvent or blends of organic/inorganic solvents in combination with trichloroacetic acid (TCA) and/or dichloroacetic acid (DCA) or comprising an organic or inorganic solvent or blends of organic/inorganic solvents in combination with trichloroacetic acid (TCA) and/or dichloroacetic acid optionally in combination with inorganic silicon compounds, the latter preferably selected from the group of: talcs, wollastonite, silica, montmorillonites and kaolins, aimed at modifying the surface tension and accordingly the wettability of the polymer film itself, the support layer according to the present invention, making it possible to accomplish on the external polymer surface of the used generic polymer film, not in contact with the low-melting polyurethane film, in particular low-melting polyurethane having a melting temperature not higher than 150° C., the printing of electrically conductive circuits through the deposition of inks implemented with organic and/or inorganic conductive materials printed with the usual silkscreen and digital inkjet techniques and the connection of the latter with electronic devices.

In addition, this treatment modifying the surface properties of the generic polymer film, the support layer according to the present invention, makes it possible to achieve, on the internal polymer surface of the film in use, in contact with the generic low-melting polyurethane film, in particular low-melting polyurethane having a melting temperature not higher than 150° C., adherence, after heating the polyurethane film itself, between the polymer film printed with electric circuits and the low-melting polyurethane film.

The generic low-melting polyurethane film, after heating, in its turn allows the conductive printed system applied above the polyurethane film through the polymer film carrier to adhere to a textile support, whether flexible or not flexible, whether two-dimensional or three-dimensional. The coupled system for transferring and applying electronically conductive components on flexible and not flexible textile supports which is the object of the present invention makes it possible in a highly innovative manner to protect and maintain the ink electric conduction constant along the whole printed conductive track, in such a way that the printed inks are not affected by any charge interruption due to surface unevenness and to the chemical-physical properties of the substrate they are printed on; also, it allows clamping to be stable over time, with a high thermal and dimensional stability of the hard conductive components applied to the reference substrate, mechanical stresses or aging of the surface treatments applied to the print substrates not impairing the conductive performances and the quality of the end device.

Using this innovative system, a system with at least two layers according to the present invention comprising, preferably consisting of: 1) both an upper layer, support layer according to the present invention, implemented with a generic transparent and colourless polymer film, thermally pretreated in order to ensure a dimensional variation—shrinkage or elongation—as a result of thermal stress within the limit of 0.2% compared to the original size of the polymer film and duly modified on both its surfaces through an activation system, comprising an activating agent for said surfaces, such as a chemical treatment with said activation system comprising said activating agent, such as a formulation based on an organic or inorganic solvent or blends of organic/inorganic solvents in combination with trichloroacetic acid (TCA) and/or dichloroacetic acid (DCA) or a formulation based on an organic or inorganic solvent or blends of organic/inorganic solvents in combination with trichloroacetic acid (TCA) and/or dichloroacetic acid optionally in combination with inorganic silicon compounds, the latter preferably selected from the group of: talcs, wollastonite, silica, montmorillonites and kaolins, aimed at modifying the surface tension of the polymer film itself, 2) and a lower layer of a generic low-melting polyurethane film, having a melting temperature not higher than the one used for thermostabilization (150° C.) of the generic polymer film forming the upper layer, a support layer according to the present invention, of the suggested system, in such a way that both during the thermal coupling of the upper layer, a support layer according to the present invention, with the lower layer, a low-melting polyurethane layer according to the present invention, and during the thermal transfer of the coupled system onto fabric, no dimensional variation of the upper layer, a support layer according to the present invention, occurs, the above-mentioned technical drawbacks can be overcome.

The layer of the generic polymer film, dimensionally and thermally stabilized and treated on both its surfaces with a chemical formulation based on an organic or inorganic solvent or blends of organic/inorganic solvents in combination with trichloroacetic acid (TCA) and/or dichloroacetic acid (DCA) or with a formulation based on an organic or inorganic solvent or blends of organic/inorganic solvents in combination with trichloroacetic acid (TCA) and/or dichloroacetic acid optionally in combination with inorganic silicon compounds, the latter preferably selected from the group of: talcs, wollastonite, silica, montmorillonites and kaolins, allows the surface tension and hence the wettability of the polymer film, the support layer according to the present invention, to be modified, promoting the adherence and engagement of the conductive inks which are to printed thereon. Furthermore, the lower flexibility of the generic polymer film compared to that of a generic polyurethane film makes it possible to apply on the external surface of the generic polymer film, not in contact with the low-melting polyurethane film, in particular low-melting polyurethane having a melting temperature not higher than 150° C., electronic devices for reading, processing and transmitting data; moreover, this treatment changing the surface properties of the generic polymer film makes it possible to achieve, on the internal polymer surface of the film, in contact with the low-melting polyurethane film, in particular low-melting polyurethane having a melting temperature not higher than 150° C., adherence, after heating the polyurethane film itself, between the polymer film printed with electric circuits and the low-melting polyurethane film. The generic low-melting polyurethane film, in particular low-melting polyurethane having a melting temperature not higher than 150° C., after heating will in its turn allow the conductive printed system applied above the polyurethane film through the polymer film carrier to adhere to a textile support, whether flexible or not flexible.

Lastly, it will be possible to protect the double-layer system, a system with at least two layers according to the present invention, as generic polymer film/low-melting polyurethane, against external aggressive chemical and physical agents through a protective coating by a protective coating achieved by applying, above the electric circuit itself, either a further layer of a generic high-melting polyurethane film, previously coloured in an even manner throughout its surface and/or decorated with a further digital print, or by one or more direct silkscreen prints. The coupled system for transferring and applying electronically conductive components on flexible and not flexible textile supports, which is the object of the present invention, will make it possible in a highly innovative manner to protect and maintain the ink electric conduction constant along the whole printed conductive track, in such a way that the printed inks are not affected by any charge interruption due to surface unevenness and to the chemical-physical properties of the substrate they are printed on; also, it will allow clamping to be stable over time, with a high thermal and dimensional stability, on account of the thermal pre-treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, a treatment which the polymer film has been previously subjected to, of the hard conductive components to the substrate they are applied to, mechanical stresses or aging of the surface treatments applied to the print substrates not impairing the conductive performances and the quality of the end device.

The coupled system so implemented, which is the object of the present invention, will thus make it possible to apply printed electronic components on several kinds of flexible and not flexible textile substrates which are used in several application fields such as electronic devices for measuring, processing and transmitting data, the fashion field to achieve fashionable interactive and highly technological fabrics, the medical field in order to manufacture devices for monitoring and transmitting real-time data relating to the health of an individual and the individual's sports performances, lastly as antishoplifting devices to be applied on clothing items in the field of shop safety.

DETAILED DESCRIPTION OF THE INVENTION

An object of the present invention is therefore the creation of an innovative dual-layer polymer system, a system with at least two layers according to the present invention, between a generic transparent and colourless polymer film, a support layer according to the present invention, and a generic low-melting polyurethane film, a low-melting polyurethane according to the present invention, to be used as system for transferring and applying electronic components, printed both through silkscreen and through digital techniques and connected to hard electronic devices for measuring, processing and transmitting data, on flexible and not flexible textile substrates.

The dual-layer innovative system, a system with at least two layers according to the present invention, which is the object of the present invention, comprises, preferably consists of: 1) an upper layer, a support layer according to the present invention, of a generic transparent and colourless polymer film, thermally and dimensionally pre-treated in such a way as to ensure a high level of reliability as regards its dimensional stability and duly modified on both its surfaces through a chemical treatment with a formulation based on an organic or inorganic solvent or blends of organic/inorganic solvents in combination with trichloroacetic acid (TCA) and/or dichloroacetic acid (DCA) or with a formulation based on an organic or inorganic solvent or blends of organic/inorganic solvents in combination with trichloroacetic acid (TCA) and/or dichloroacetic acid optionally in combination with inorganic silicon compounds, the latter preferably selected from the group of: talcs, wollastonite, silica, montmorillonites and kaolins, aimed at changing the surface tension and hence the wettability of the polymer film itself, 2) a lower layer of a generic low-melting polyurethane film, having a melting temperature not higher than the one used for thermostabilization (150° C.) of the generic polymer film forming the upper layer, a support layer according to the present invention, of the suggested system, in such a way that both during the thermal coupling of the upper layer, a support layer according to the present invention, with the lower layer, a low-melting polyurethane layer according to the present invention, and during the thermal transfer of the coupled system onto fabric, whether flexible or not flexible, no dimensional variation of the upper layer, a support layer according to the present invention, occurs.

The suggested innovation makes it possible to accomplish on the external polymer surface of the used generic polymer film, not in contact with the low-melting polyurethane film, in particular low-melting polyurethane having a melting temperature not higher than 150° C., the printing of electrically conductive circuits through the deposition of inks implemented with organic and/or inorganic conductive materials printed with the usual silkscreen and digital inkjet techniques and the connection of the latter with electronic devices; also, the described treatment of modification of the surface properties of the generic polymer film forming the upper layer, a support layer according to the present invention of the suggested innovative double-layer system, a system with at least two layers according to the present invention, makes it possible to achieve, on the internal polymer surface of the film in use, in contact with the generic low-melting polyurethane film, in particular low-melting polyurethane having a melting temperature not higher than 150° C., adherence, after heating the polyurethane film itself, between the polymer film printed with electric circuits and the generic low-melting polyurethane film.

Furthermore, in the suggested invention, the generic low-melting polyurethane film, in particular low-melting polyurethane having a melting temperature not higher than 150° C., after heating, allows the conductive printed system applied above the polyurethane film through the polymer film carrier to adhere to a textile support, whether flexible or not flexible.

The coupled system for transferring and applying electronically conductive components on flexible and not flexible textile supports, which is the object of the present invention, allows the following technical drawbacks to be overcome:

it makes it possible to protect and maintain the ink electric conduction constant along the whole printed conductive track, in such a way that the printed inks are not affected by any charge interruption due to surface unevenness and to the chemical-physical properties of the substrate they are printed on;

it allows clamping to be stable over time, with a high thermal and dimensional stability of the hard conductive components applied to the reference substrate, mechanical stresses or aging of the surface treatments applied to the print substrates not impairing the conductive performances and the quality of the end device.

In detail, the present inventions consists of a dual-layer system, a system with at least two layers according to the present invention, implemented between a component A)

upper layer, a support layer according to the present invention, and a component B) lower layer, a low-melting polyurethane layer according to the present invention; specifically, component A) upper layer, a support layer according to the present invention, is characterized by:

1) a generic transparent and colourless polymeric film, selected from the families of polyetheroketones, polyetherosulfones, sulfonated polyetherosulfones, polyacrylates, polymethacrylates, polyesters, polyethers, polycarbonates and from the families of the polymer film compounds obtained from polyetheroketones and polyetherosulfones, polyetheroketones and sulfonated polyetherosulfones, polyetherosulfones and sulfonated polyetherosulfones, polyacrylates and polymethacrylates, polyacrylates and polyesters, polymethacrylates and polyesters, polyacrylates and polyethers, polymethacrylates and polyethers, polyesters and polycarbonates, preferably belonging to the family of polyesters, wherein, in a particularly preferred preparation, the generic transparent and colourless polymer film is polyethylene terephthalate.

2) the generic transparent and colourless polymer film described in point 1), namely the support layer according to the present invention, is thermally thermostabilized at 150° C. to ensure a dimensional stability to the generic polymer film described in point 1), in order to achieve a shrinking or elongation percentage of the general polymer film, namely of the support layer according to the present invention, within 0.2% compared to the starting size of the film itself, if the polymer film is subjected to treatments providing heating up to a temperature matching the one of the thermal thermostabilization of the generic polymer film.

3) the generic transparent and colourless, thermally thermostabilized polymer film described in points 1) and 2), namely the support layer according to the present invention, is treated on both its surfaces with an activation system, comprising an activating agent according to the present invention, such as a formulation based on an organic or inorganic solvent or blends of organic/inorganic solvents and trichloroacetic acid (TCA) and/or dichloroacetic acid (DCA) or a formulation based on an organic or inorganic solvent or blends of organic/inorganic solvents, trichloroacetic acid (TCA) and/or dichloroacetic acid optionally in combination with inorganic silicon compounds, the latter preferably selected from the group of: talcs, wollastonite, silica, montmorillonites and kaolins, aimed at modifying the surface tension and hence the wettability of the polymer film itself, namely the support layer according to the present invention, the activation system, comprising an activating agent according to the present invention, aimed at modifying the surface properties of the generic polymer film, namely the support layer according to the present invention, preferably comprises a non-chlorinated organic solvent selected from aromatic and non-aromatic alcohols, aromatic and non-aromatic hexanes, dimethylacetamide, dimethylformamide and dimethyl sulfoxide or an inorganic solvent selected from aromatic and non-aromatic chlorinated solvents and water or blends of aromatic and non aromatic alcohols and water, and aromatic and non-aromatic hexanes and water, containing as activating agent trichloroacetic acid (TCA) and/or dichloroacetic acid (DCA), optionally in combination with inorganic silicon compounds, the latter preferably selected from the group of: talcs, wollastonite, silica, montmorillonites and kaolins; the activation system preferably comprises a non-chlorinated organic solvent selected from aromatic and non-aromatic alcohols or an inorganic solvent such as water, and an activating agent such as trichloroacetic acid (TCA) or dichloroacetic acid (DCA) in combination with inorganic silicon compounds selected from the families of silicas and montmorillonites; moreover, this activation system in a preferred form of embodiment contains a non-chlorinated inorganic solvent such as water, with trichloroacetic acid (TCA) and with inorganic silicon compounds selected from the family of silicas. The activation system, comprising an activating agent according to the present invention, for modifying the surface properties, is applied in a thin layer, with ordinary techniques such as mayer bar, air blade or spray, on the polymer film belonging to the families described above, the support layer according to the present invention, preferably with a basic weight between 0.1 and 10 grams/m$^2$, and is dried in the presence of ventilation and/or heating, and preferably with heating at a processing temperature between 80 and 160° C. The component B) lower layer, a low-melting polyurethane layer according to the present invention, of the double-layer system, a system with at least two layers according to the present invention, consists of:

4) a film of any low-melting polyurethane, having a melting temperature not higher than the one used for thermostabilization (150° C.) of the generic polymer film forming the upper layer, a support layer according to the present invention, of the suggested system, in such a way that both during the thermal coupling of the upper layer, a support layer according to the present invention, with the lower layer, a low-melting polyurethane layer according to the present invention, and during the thermal transfer of the coupled system onto fabric, no dimensional variation of the upper layer, a support layer according to the present invention, occurs.

The double-layer polymer system, a system with at least two layers according to the present invention, thus described, is assembled through thermal pressure between the two films A) and B), that is component A) and component B) as defined above, using a thermal press at a pressure of 4-6 mbar and at a temperature not higher than the one used for the dimensional thermostabilization of the upper polymer layer, a support layer according to the present invention, of the suggested system, in such a way that the internal polymer surface of the film A), component A), steadily adheres to the internal polymer surface of the film B), component B).

Moreover, the double-layer system, a system with at least two layers according to the present invention, thus obtained can be printed with:

5) electrically conductive inks of both an organic and an inorganic nature, both blends of organic conductive elements and inorganic conductive elements, through the ordinary inkjet and silkscreen printing techniques, on the external side of the generic transparent, colourless polymer film, dimensionally thermostabilized and duly treated on both its surfaces as described in points 1), 2) and 3). The inks described in point 5) can be connected to 6) hard electronic devices, clamping them on the external side of the generic polymer film described in points 1), 2) and 3) through the specific adhesive glues for that hard electronic device.

The inks printed and described in point 5) and the hard electronic devices described in point 6) connected thereto may be coated as protection against external aggressive chemical and physical agents with a layer of any high-melting polyurethane, characterized by a melting temperature of 150° C. or less, previously coloured in an even manner and/or decorated with a further silkscreen printing technology.

The double-layer system, a system with at least two layers according to the present invention, thus obtained can be transferred onto any textile support, whether flexible or not flexible, through thermal pressure, operating in an estimated thermal range between 4 and 6 mbar and operating at a temperature not higher than the one used during the step of thermostabilizing the upper polymer layer, a support layer according to the present invention, forming the double-layer system, a system with at least two layers according to the present invention, which is the object of the present invention, so that the external polymer surface of the film B) adheres to the selected textile surface of interest.

According to the present invention, the polymer material/polymer is considered to be dimensionally stabilized if the dimensional variation measured before and after the thermal treatment, in particular in the oven, in particular the thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is less than 0.2% as a result of shrinking or elongation, the dimensional variation of the polymer film itself being on both the measured sides, namely the support layer according to the present invention.

The following embodiments are therefore further objects of the present invention:

1) A system with at least two layers comprising a support layer containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, the support layer having at least partially wrinkled surfaces because they are treated with an activating agent which is suitable to perform an etching process and/or to modify the surface tension of said surfaces, with which a low-melting polyurethane layer is coupled, having a melting temperature not higher than 150° C.

2) A system with at least two layers according to embodiment 1) wherein the activating agent, an activating agent suitable to perform an etching process and/or to modify the surface tension of the surfaces of the support layer, is at least: trichloroacetic acid (TCA) and/or dichloroacetic acid (DCA), optionally in combination with inorganic silicon compounds.

3) A system with at least two layers according to embodiment 1) wherein the activating agent, an activating agent suitable to perform an etching process and/or to modify the surface tension of the surfaces of the support layer, is available on said surfaces in an amount ranging from a minimum quantity per surface unit between 0.015 mg/mm$^2$ and 0.02 mg/mm$^2$ to a maximum quantity per surface unit between 0.12 mg/mm$^2$ and 0.22 mg/mm$^2$.

4) A system with at least two layers according to embodiment 1) wherein the activating agent, an activating agent suitable to perform an etching process and/or to modify the surface tension of the surfaces of the support layer, is at least: trichloroacetic acid (TCA) and/or dichloroacetic acid (DCA), optionally in combination with inorganic silicon compound, and is available on said surfaces in an amount ranging from a minimum quantity per surface unit between 0.015 mg/mm$^2$ and 0.02 mg/mm$^2$ to a maximum quantity per surface unit between 0.12 mg/mm$^2$ and 0.22 mg/mm$^2$.

5) A system with at least two layers according to embodiments 2) or 4) wherein the inorganic silicon compounds are selected from the families of talcs, wollastonite, silica, montmorillonites and kaolins, or combinations thereof.

6) A system with at least two layers according to embodiment 1) wherein the polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is selected from the families of polyetheroketones, polyetherosulfones, sulfonated polyetherosulfones, polyacrylates, polymethacrylates, polyesters, polyethers, polycarbonates and from the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates.

7) A system with at least two layers according to embodiment 6) wherein the polymer is selected from the families of polyacrylates, polyesters, polycarbonates and their compounds from polyacrylates and polyesters, polyesters and polycarbonates.

8) A system with at least two layers according to embodiment 6) wherein the polymer belongs to the family of polyesters, in particular is polyethylene terephthalate.

9) A system with at least two layers according to embodiment 1) wherein the support layer containing a polymer selected from: polyetheroketones, polyetherosulfones, sulfonated polyetherosulfones, polyacrylates, polymethacrylates, polyesters, polyethers, polycarbonates, compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates, and whose surfaces are treated with an activating agent which is at least trichloroacetic acid (TCA) and/or dichloroacetic acid (DCA), optionally in combination with inorganic silicon compounds selected from the group of: talcs, wollastonite, silica, montmorillonites and kaolins, said support layer is coupled with a low-melting polyurethane layer, having a melting temperature not higher than 150° C.

10) A system with at least two layers according to embodiment 1) wherein the support layer comprises polyethylene terephthalate, whose surfaces are treated with an activating agent which is at least trichloroacetic acid (TCA) and/or dichloroacetic acid (DCA), optionally in combination with inorganic silicon compounds selected from the group of: talcs, wollastonite, silica, montmorillonites and kaolins, the polyethylene terephthalate being coupled with a low-melting polyurethane layer, having a melting temperature not higher than 150° C.

Another particularly preferred form of embodiment of the system with at least two layers according to the present invention is:

i) A system with at least two layers wherein the support layer, containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is a polymer selected from: polyethylene terephthalate, polyetheroketones, polyetherosulfones, sulfonated polyetherosulfones, polyacrylates, polymethacrylates, polyesters, polyethers, polycarbonates and from the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates, whose surfaces have been treated with and/or on whose surfaces at least: trichloroacetic acid (TCA) and/or dichloroacetic acid (DCA), optionally in combination with inorganic silicon compounds selected from the group of: talcs, wollastonite, silica, montmorillonites and kaolins, are available, said support layer being coupled with a low-melting polyurethane layer, having a melting temperature not higher than 150° C.

A further object of the present invention is the use of the system with at least two layers according to the present invention as means or system for transferring electrically conductive ink suitable to receive and transfer [afterwards connecting said electrically conductive ink with one or more electronic components/devices], said ink onto a [flexible or not flexible, two-dimensional or three-dimensional] textile support, through thermal transfer.

The following embodiments are therefore further objects of the present invention:

a) A means for transferring electrically conductive ink suitable to receive and transfer [afterwards connecting said electrically conductive ink with one or more electronic components/devices], said ink onto a [flexible or not flexible, two-dimensional or three-dimensional] textile support, through thermal transfer, said means comprising a system with at least two layers wherein a support layer containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, the support layer having at least partially wrinkled surfaces because they are treated with an activating agent which is suitable to perform an etching process and/or to modify the surface tension of said surfaces, is coupled with a low-melting polyurethane layer, having a melting temperature not higher than 150° C.

b) A means for transferring ink comprising a system with at least two layers according to embodiment a) wherein the activating agent, an activating agent suitable to perform an etching process and/or to modify the surface tension of the surfaces of the support layer, is at least: trichloroacetic acid (TCA) and/or dichloroacetic acid (DCA), optionally in combination with inorganic silicon compounds.

c) A means for transferring ink comprising a system with at least two layers according to embodiment a) wherein the activating agent, an activating agent suitable to perform an etching process and/or to modify the surface tension of the surfaces of the support layer, is available on said surfaces in an amount ranging from a minimum quantity per surface unit between 0.015 mg/mm$^2$ and 0.02 mg/mm$^2$ to a maximum quantity per surface unit between 0.12 mg/mm$^2$ and 0.22 mg/mm$^2$.

d) A means for transferring ink comprising a system with at least two layers according to embodiment a) wherein the activating agent, an activating agent suitable to perform an etching process and/or to modify the surface tension of the surfaces of the support layer, is at least: trichloroacetic acid (TCA) and/or dichloroacetic acid (DCA), optionally in combination with inorganic silicon compound, and is available on said surfaces in an amount ranging from a minimum quantity per surface unit between 0.015 mg/mm$^2$ and 0.02 mg/mm$^2$ to a maximum quantity per surface unit between 0.12 mg/mm$^2$ and 0.22 mg/mm$^2$.

e) A means for transferring ink comprising a system with at least two layers according to embodiments b) or d) wherein the inorganic silicon compounds are selected from the families of talcs, wollastonite, silica, montmorillonites and kaolins, or combinations thereof.

f) A means for transferring ink comprising a system with at least two layers according to embodiment a) wherein the polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is selected from the families of polyetheroketones, polyetherosulfones, sulfonated polyetherosulfones, polyacrylates, polymethacrylates, polyesters, polyethers, polycarbonates and from the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates.

g) A means for transferring ink comprising a system with at least two layers according to embodiment f) wherein the polymer is selected from the families of polyacrylates, polyesters, polycarbonates and their compounds from polyacrylates and polyesters, polyesters and polycarbonates.

h) A means for transferring ink comprising a system with at least two layers according to embodiment f) wherein the polymer belongs to the family of polyesters, in particular is polyethylene terephthalate.

i) A means for transferring ink comprising a system with at least two layers according to embodiment a) wherein the support layer containing a polymer selected from: polyetheroketones, polyetherosulfones, sulfonated polyetherosulfones, polyacrylates, polymethacrylates, polyesters, polyethers, polycarbonates, compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates, and whose surfaces are treated with an activating agent which is at least trichloroacetic acid (TCA) and/or dichloroacetic acid (DCA), optionally in combination with inorganic silicon compounds selected from the group of: talcs, wollastonite, silica, montmorillonites and kaolins, said support layer is coupled with a low-melting polyurethane layer, having a melting temperature not higher than 150° C.

j) A means for transferring ink comprising a system with at least two layers according to embodiment a) wherein the support layer comprises polyethylene terephthalate, whose surfaces are treated with an activating agent which is at least trichloroacetic acid (TCA) and/or dichloroacetic acid (DCA), optionally in combination with inorganic silicon compounds selected from the group of: talcs, wollastonite, silica, montmorillonites and kaolins, the polyethylene terephthalate being coupled with a low-melting polyurethane layer, having a melting temperature not higher than 150° C.

Another particularly preferred form of embodiment of the means for transferring ink comprising a system with at least two layers according to the present invention is:

ii) A means for transferring electrically conductive ink suitable to receive and transfer [afterwards connecting said electrically conductive ink with one or more electronic components/devices], said ink onto a [flexible or not flexible, two-dimensional or three-dimensional] textile support, through thermal transfer, said means comprising a system with at least two layers wherein the support layer containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is a polymer selected from: polyethylene terephthalate, polyetheroketones, polyetherosulfones, sulfonated polyetherosulfones, polyacrylates, polymethacrylates, polyesters, polyethers, polycarbonates and from the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates, whose surfaces have been treated with and/or on whose surfaces at least: trichloroacetic acid (TCA) and/or dichloroacetic acid (DCA), optionally in combination with inorganic silicon compounds selected from the group of: talcs, wollastonite, silica, montmorillonites and kaolins, are available, said support layer being coupled with a low-melting polyurethane layer, having a melting temperature not higher than 150° C.

The following embodiments are therefore further objects of the present invention:

I) A system for transferring electrically conductive ink suitable to receive and transfer [afterwards connecting said electrically conductive ink with one or more electronic components/devices], said ink onto a [flexible or not flexible, two-dimensional or three-dimensional] textile support, through thermal transfer, said system comprising a support layer containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, a low-melting polyurethane layer, having a melting temperature not higher than 150° C., and an activation system for the surfaces of the support layer, said activation system comprising an activating agent, the activating agent being suitable to perform an etching process and/or to modify the surface tension of said surfaces, wherein said activation system for the surfaces of the support layer is interposed between the support layer and the low-melting polyurethane layer and is applied on the external surface of the support layer suitable to receive the ink.

II) A system for transferring ink comprising a system with at least two layers according to embodiment I) wherein the activating agent, an activating agent suitable to perform an etching process and/or to modify the surface tension of the surfaces of the support layer, is at least: trichloroacetic acid (TCA) and/or dichloroacetic acid (DCA), optionally in combination with inorganic silicon compounds.

III) A system for transferring ink comprising a system with at least two layers according to embodiment I) I) wherein the activating agent, an activating agent suitable to perform an etching process and/or to modify the surface tension of the surfaces of the support layer, is available in said activation system at concentrations ranging between 10 and 90% in weight of said activation system.

IV) A system for transferring ink comprising a system with at least two layers according to embodiment I) wherein the activating agent, an activating agent suitable to perform an etching process and/or to modify the surface tension of the surfaces of the support layer, is at least: trichloroacetic acid (TCA) and/or dichloroacetic acid (DCA), optionally in combination with inorganic silicon compounds, and is available in said activation system at concentrations ranging between 10 and 90% in weight of said activation system.

V) A system for transferring ink comprising a system with at least two layers according to embodiments II) or IV) wherein the inorganic silicon compounds are selected from the families of talcs, wollastonite, silica, montmorillonites and kaolins, or combinations thereof.

VI) A system for transferring ink comprising a system with at least two layers according to embodiment I) wherein the polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is selected from the families of polyetheroketones, polyetherosulfones, sulfonated polyetherosulfones, polyacrylates, polymethacrylates, polyesters, polyethers, polycarbonates and from the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates.

VII) A system for transferring ink comprising a system with at least two layers according to embodiment VI) wherein the polymer is selected from the families of polyacrylates, polyesters, polycarbonates and their compounds from polyacrylates and polyesters, polyesters and polycarbonates.

VIII) A system for transferring ink comprising a system with at least two layers according to embodiment VI) wherein the polymer belongs to the family of polyesters, in particular is polyethylene terephthalate.

IX) A system for transferring ink comprising a system with at least two layers according to embodiment I) wherein the support layer containing a polymer selected from: polyetheroketones, polyetherosulfones, sulfonated polyetherosulfones, polyacrylates, polymethacrylates, polyesters, polyethers, polycarbonates, compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates, is combined with a low-melting polyurethane layer, having a melting temperature not higher than 150° C., and an activation system for the surfaces of the support layer, said activation system comprising an activating agent, the activating agent being suitable to perform an etching process and/or to modify the surface tension of said surfaces, said activating agent being at least trichloroacetic acid (TCA) and/or dichloroacetic acid (DCA), optionally in combination with inorganic silicon compounds selected from the group of: talcs, wollastonite, silica, montmorillonites and kaolins, wherein said activation system for the surfaces of the support layer is interposed between the support layer and the low-melting polyurethane layer and is applied on the external surface of the support layer suitable to receive the ink.

X) A system for transferring ink comprising a system with at least two layers according to embodiment I) wherein the support layer comprising polyethylene terephthalate is combined with a low-melting polyurethane layer, having a melting temperature not higher than 150° C., and an activation system for the surfaces of the support layer, said activation system comprising an activating agent, the activating agent being suitable to perform an etching process and/or to modify the surface tension of said surfaces, said activating agent being at least trichloroacetic acid (TCA) and/or dichloroacetic acid (DCA), optionally in combination with inorganic silicon compounds selected from the group of: talcs, wollastonite, silica, montmorillonites and kaolins, wherein said activation system for the surfaces of the support layer is interposed between the support layer comprising polyethylene and the low-melting polyurethane layer and is applied on the external surface of the support layer comprising polyethylene suitable to receive the ink.

Another particularly preferred form of embodiment of the system for transferring ink comprising a system with at least two layers according to the present invention is:

iii) A system for transferring electrically conductive ink suitable to receive and transfer [afterwards connecting said electrically conductive ink with one or more electronic components/devices], said ink onto a [flexible or not flexible, two-dimensional or three-dimensional] textile support, through thermal transfer, said system comprising a system with at least two layers, wherein the support layer, containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is a polymer selected from: polyethylene terephthalate, polyetheroketones, polyetherosulfones, sulfonated polyetherosulfones, polyacrylates, polymethacrylates, polyesters, polyethers, polycarbonates and from the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates, combined with a low-melting polyurethane layer, having a melting temperature not higher than 150° C., and an activation system for the surfaces of the support layer, said activation system comprising an activating agent, the activating agent being suitable to perform an etching process and/or to modify the surface tension of said surfaces, said activating agent being at least trichloroacetic acid (TCA) and/or dichloroacetic acid (DCA), optionally in combination with inorganic silicon compounds selected from the group of: talcs, wollastonite, silica, montmorillonites and kaolins, wherein said activation system for the surfaces of the support layer is interposed between the support layer and the low-melting polyurethane layer and is applied on the external surface of the support layer suitable to receive the ink.

The following process embodiments are therefore further objects of the present invention:

α) A process for achieving: a system with at least two layers according to embodiment 1), or a means for transferring conductive ink comprising a system with at least two layers according to embodiment a), or a system for transferring conductive ink comprising a system with at least two layers according to embodiment I), wherein in said process:

the surfaces of the support layer containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, are pre-treated by applying thereon an activation system comprising an activating agent for the surfaces of said support layer at a concentration between 10 and 90% in weight of said activation system, in the form of a thin layer, with precision techniques, such as an air blade or a mayer bar or a spray system, preferably with a basic weight between 0.1 and 10 grams/m$^2$ and dried in the presence of ventilation and/or heating, and preferably with heating at a processing temperature between 80 and 160° C., said support layer thus pre-treated is coupled with a low-melting polyurethane layer having a melting temperature not higher than 150° C. thermal press at a pressure of 4-6 mbar and at a temperature not higher than 150° C.

β) A process for achieving: a system with at least two layers according to embodiment 1), or a means for transferring conductive ink comprising a system with at least two layers according to embodiment a), or a system for transferring conductive ink comprising a system with at least two layers according to embodiment I), according to embodiment α) wherein the polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, is selected from polyethylene terephthalate, polyetheroketones, polyetherosulfones, sulfonated polyetherosulfones, polyacrylates, polymethacrylates, polyesters, polyethers, polycarbonates, compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates.

γ) A process for achieving: a system with at least two layers according to embodiment 1), or a means for transferring conductive ink comprising a system with at least two layers according to embodiment a), or a system for transferring conductive ink comprising a system with at least two layers according to embodiment I), according to embodiment a) wherein the activating agent is at least trichloroacetic acid (TCA) and/or dichloroacetic acid (DCA), optionally in combination with inorganic silicon compounds, the latter preferably selected from the group of: talcs, wollastonite, silica, montmorillonites and kaolins.

δ) A process for achieving: a system with at least two layers according to embodiment 1), or a means for transferring conductive ink comprising a system with at least two layers according to embodiment a), or a system for transferring conductive ink comprising a system with at least two layers according to embodiment I), according to embodiment a) wherein the polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 second, in particular waiting for approximately 30 seconds that the polymeric material to return at/to room temperature, is polyethylene terephthalate and the activating agent is at least trichloroacetic acid (TCA) and/or dichloroacetic acid (DCA), optionally in combination with inorganic silicon compounds, the latter preferably selected from the group of: talcs, wollastonite, silica, montmorillonites and kaolins.

The thickness of the support layer according to the present invention may range from 350 to 12 micrometres, preferably from 200 to 15 micrometres, more preferably from 100 to 20 micrometres and even more preferably from 75 to 23 micrometres.

The thickness of the low-melting polyurethane layer, in particular low-melting polyurethane having a melting temperature not higher than 150° C., according to the present invention may range from 300 to 10 micrometres, preferably from 200 to 15 micrometres, more preferably from 60 to 20 micrometres and even more preferably from 30 to 20 micrometres.

Definitions

The term "activating agent" according to the present invention is to be understood as an activating agent suitable to perform an etching process and/or to modify the surface tension of the surfaces of a support layer containing a polymer thermostabilized at a temperature not higher than 150° C. and with a dimensional variation not higher than 0.2% when subjected to a thermal treatment, in particular a thermal treatment in an oven at 150° C. for 40 seconds and at room temperature for approximately 30 seconds, that is a thermal treatment of said polymer comprising keeping said polymer in an oven at 150° C. for 40 seconds and then at room temperature for approximately 30 seconds, in particular waiting for approximately 30 seconds that the polymeric material to return at/to room temperature, namely a polymer selected from the group comprising: polyethylene terephthalate, polyetheroketones, polyetherosulfones, sulfonated polyetherosulfones, polyacrylates, polymethacrylates, polyesters, polyethers, polycarbonates, compounds of polyetheroketones and polyetherosulfones, compounds of polyetheroketones and sulfonated polyetherosulfones, compounds of polyetherosulfones and sulfonated polyetherosulfones, compounds of polyacrylates and polymethacrylates, compounds of polyacrylates and polyesters, compounds of polymethacrylates and polyesters, compounds of polyacrylates and polyethers, compounds of polymethacrylates and polyethers, compounds polyesters and polycarbonates; preferably said activating agents according to the present invention is at least one compound selected from the group comprising: trichloroacetic acid (TCA) and/or dichloroacetic acid (DCA), optionally in combination with inorganic silicon compounds, such as those selected from the group of: talcs, wollastonite, silica, montmorillonites and kaolins.

When they are both present, trichloroacetic acid (TCA) and dichloroacetic acid (DCA) are in a weight ratio of 1:1.

The term "activation system" or "activation system for the surfaces of the support layer" according to the present invention is to be understood as a system comprising an activating agent as defined herein, in particular an activating agent as defined herein at a concentration between 10 and 90% in weight of the whole "activation system" or "activation system for the surfaces of the support layer".

The "activation system" or "activation system for the surfaces of the support layer" according to the present invention has a boiling temperature not higher than 150° C.

Said "activation system" or "activation system for the surfaces of the support layer" according to the present invention is preferably in the form of a solution, dispersion or emulsion, comprising a fluid means, a solvent, with a boiling temperature not higher than 150° C.

The term "textile substrate" according to the present invention is to be understood as a substrate comprising a fabric or fabrics, meaning both a fabric or fabrics of natural fibres or a fibre or fabrics of artificial/synthetic fibres or a fabric or fabrics mixing said fibres.

The "textile substrate" can be flexible and not flexible, two-dimensional or three-dimensional.

Types of natural textile fibres of vegetable origin included in the fabric or fabrics according to the present invention are: Cotton, Linen, Hemp, Jute, Ramie (or nettle thread), Sisal, Coconut, Broom, Hibiscus, Manila, Straw, Bamboo, Cork.

Types of natural textile fibres of animal origin included in the fabric or fabrics according to the present invention are: Wools such as: Merinos, Shetland, Bluefaiced Leicester, Corriedale, Cross wools, Lamb, English, Asian, Mazamet, Regenerated wools; or Hairy wools such as: Angora, Cachemire, Camel, Mohair, Alpaca, Lama, Vicuña, Buffalo, Quivut or Quivuk; Silks, Horsehait or Byssus.

Types of artificial textile fibres included in the fabric or fabrics according to the present invention are: Cellulose Fibres such as Rayon, Modal, Cupro, Acetate, Triacetate, Lyocell.

Types of synthetic textile fibres included in the fabric or fabrics according to the present invention are: acrylic fibres, polyamide fibres (for example Nylon 6, Nylon 6,6), polyester, polypropylene fibres, polyethylene fibres, chlorovinyl fibres, polyurethane fibres, Polytetrafluoroethylene fibres, Aramid fibres.

The following non limiting examples describe forms of embodiment of the present invention.

EXAMPLES

Exemplary embodiments characterizing the invention:

Example 1

1) Polymer substrate used as upper layer, support layer according to the present invention: polyacrylate film.
2) Thermostabilization of the upper layer, support layer according to the present invention, performed as specified in the technical enclosure 1.
3) Application of the formulation to modify the surface tension:
    The composition consists of:
    1) methanol;
    2) trichloroacetic acid;
    3) dichloroacetic acid.
    The composition is prepared as follows:
    In a 100-$cm^3$ flask with magnetic stir bar, 15 $cm^3$ of methanol, 1.20 g of trichloroacetic acid (10% in weight based on the quantity of solvent used) and 1.20 g of dichloroacetic acid (10% in weight based on the quantity of solvent used) are poured. The flask is closed and stirred at room temperature. The composition is stirred for about 20-30 minutes, after which it is cooled to room temperature under stirring.
    The composition is then applied at room temperature onto a surface of about 650 $cm^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 90° C.
5) Coupling of the upper polymer layer, support layer according to the present invention, with the lower layer, low-melting polyurethane layer according to the present invention, as specified in the technical enclosure 2.

Example 2

1) Polymer substrate used as upper layer, support layer according to the present invention: polycarbonate film.
2) Thermostabilization of the upper layer, support layer according to the present invention, performed as specified in the technical enclosure 1.
3) Application of the formulation to modify the surface tension:
    The composition consists of:
    1) hexane;
    2) trichloroacetic acid;
    3) dichloroacetic acid.
    The composition is prepared as follows:
    In a 100-$cm^3$ flask with magnetic stir bar, 15 $cm^3$ of hexane, 1.00 g of trichloroacetic acid (10% in weight based on the quantity of solvent used) and 1.00 g of dichloroacetic acid (10% in weight based on the quantity of solvent used) are poured. The flask is closed and stirred at room temperature. The composition is stirred for about 20-30 minutes, after which it is cooled to room temperature under stirring.
    The composition is then applied at room temperature onto a surface of about 650 $cm^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 100° C.
5) Coupling of the upper polymer layer, support layer according to the present invention, with the lower layer, low-melting polyurethane layer according to the present invention, as specified in the technical enclosure 2.

Example 3

1) Polymer substrate used as upper layer, support layer according to the present invention: polyester film.
2) Thermostabilization of the upper layer, support layer according to the present invention, performed as specified in the technical enclosure 1.
3) Application of the formulation to modify the surface tension:
The composition consists of:
1) methanol-water blend;
2) trichloroacetic acid;
3) dichloroacetic acid.
The composition is prepared as follows:
In a 100-cm$^3$ flask with magnetic stir bar, 7.5 cm$^3$ of methanol and 7.5 cm$^3$ of water, 4.70 g of trichloroacetic acid (35% in weight based on the quantity of solvent used) and 4.70 g of dichloroacetic acid (35% in weight based on the quantity of solvent used) are poured. The flask is closed and stirred at room temperature. The composition is stirred for about 20-30 minutes, after which it is cooled to room temperature under stirring.
The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 120° C.
5) Coupling of the upper polymer layer, support layer according to the present invention, with the lower layer, low-melting polyurethane layer according to the present invention, as specified in the technical enclosure 2.

Example 4

1) Polymer substrate used as upper layer, support layer according to the present invention: polyetherosulfone-sulfonated polyetherosulfone film.
2) Thermostabilization of the upper layer, support layer according to the present invention, performed as specified in the technical enclosure 1.
3) Application of the formulation to modify the surface tension:
The composition consists of:
1) methanol;
2) trichloroacetic acid;
3) silica.
The composition is prepared as follows:
In a 100-cm$^3$ flask with magnetic stir bar, 15 cm$^3$ of methanol, 2.40 g of trichloroacetic acid (20% in weight based on the quantity of solvent used) and 0.50 g of silica (20% in weight based on the quantity of trichloroacetic acid used) are poured. The flask is closed and stirred at room temperature. The composition is stirred for about 20-30 minutes, after which it is cooled to room temperature under stirring.
The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 90° C.
5) Coupling of the upper polymer layer, support layer according to the present invention, with the lower layer, low-melting polyurethane layer according to the present invention, as specified in the technical enclosure 2.

Example 5

1) Polymer substrate used as upper layer, support layer according to the present invention: polyacrylate film.
2) Thermostabilization of the upper layer, support layer according to the present invention, performed as specified in the technical enclosure 1.
3) Application of the formulation to modify the surface tension:
The composition consists of:
1) hexane;
2) dichloroacetic acid;
3) wollastonite.
The composition is prepared as follows:
In a 100-cm$^3$ flask with magnetic stir bar, 15 cm$^3$ of hexane, 6.80 g of dichloroacetic acid (70% in weight based on the quantity of solvent used) and 1.40 g of wollastonite (20% in weight based on the quantity of dichloroacetic acid used) are poured. The flask is closed and stirred at room temperature. The composition is stirred for about 20-30 minutes, after which it is cooled to room temperature under stirring.
The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 90° C.
5) Coupling of the upper polymer layer, support layer according to the present invention, with the lower layer, low-melting polyurethane layer according to the present invention, as specified in the technical enclosure 2.

Example 6

1) Polymer substrate used as upper layer, support layer according to the present invention: polyester film.
2) Thermostabilization of the upper layer, support layer according to the present invention, performed as specified in the technical enclosure 1.

3) Application of the formulation to modify the surface tension:

The composition consists of:
1) water;
2) trichloroacetic acid;
3) kaolin.

The composition is prepared as follows:

In a 100-cm$^3$ flask with magnetic stir bar, 15 cm$^3$ of water, 2.40 g of trichloroacetic acid (20% in weight based on the quantity of solvent used) and 0.50 g of kaolin (20% in weight based on the quantity of trichloroacetic acid used) are poured. The flask is closed and stirred at room temperature. The composition is stirred for about 20-30 minutes, after which it is cooled to room temperature under stirring.

The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 90° C.

5) Coupling of the upper polymer layer, support layer according to the present invention, with the lower layer, low-melting polyurethane layer according to the present invention, as specified in the technical enclosure 2.

Example 7

1) Polymer substrate used as upper layer, support layer according to the present invention: polyester film.
2) Thermostabilization of the upper layer, support layer according to the present invention, performed as specified in the technical enclosure 1.
3) Application of the formulation to modify the surface tension:

The composition consists of:
1) water;
2) trichloroacetic acid;
3) silica.

The composition is prepared as follows:

In a 100-cm$^3$ flask with magnetic stir bar, 15 cm$^3$ of water, 2.40 g of trichloroacetic acid (20% in weight based on the quantity of solvent used) and 0.50 g of silica (20% in weight based on the quantity of trichloroacetic acid used) are poured. The flask is closed and stirred at room temperature. The composition is stirred for about 20-30 minutes, after which it is cooled to room temperature under stirring.

The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 90° C.

5) Coupling of the upper polymer layer, support layer according to the present invention, with the lower layer, low-melting polyurethane layer according to the present invention, as specified in the technical enclosure 2.

Example 8

1) Polymer substrate used as upper layer, support layer according to the present invention: polyacrylate film.
2) Thermostabilization of the upper layer, support layer according to the present invention, performed as specified in the technical enclosure 1.
3) Application of the formulation to modify the surface tension:

The composition consists of:
1) methanol;
2) trichloroacetic acid.

The composition is prepared as follows:

In a 100-cm$^3$ flask with magnetic stir bar, 15 cm$^3$ of methanol, 8.30 g of trichloroacetic acid (70% in weight based on the quantity of solvent used) are poured. The flask is closed and stirred at room temperature. The composition is stirred for about 20-30 minutes, after which it is cooled to room temperature under stirring.

The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 120° C.

5) Coupling of the upper polymer layer, support layer according to the present invention, with the lower layer, low-melting polyurethane layer according to the present invention, as specified in the technical enclosure 2.

Example 9

1) Polymer substrate used as upper layer, support layer according to the present invention: polycarbonate film.
2) Thermostabilization of the upper layer, support layer according to the present invention, performed as specified in the technical enclosure 1.
3) Application of the formulation to modify the surface tension:

The composition consists of:
1) methanol;
2) dichloroacetic acid.

The composition is prepared as follows:

In a 100-cm$^3$ flask with magnetic stir bar, 15 cm$^3$ of methanol, 8.30 g of dichloroacetic acid (70% in weight based on the quantity of solvent used) are poured. The flask is closed and stirred at room temperature. The composition is stirred for about 20-30 minutes, after which it is cooled to room temperature under stirring.

The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 150° C.

5) Coupling of the upper polymer layer, support layer according to the present invention, with the lower layer, low-melting polyurethane layer according to the present invention, as specified in the technical enclosure 2.

Example 10

1) Polymer substrate used as upper layer, support layer according to the present invention: polyetheroketone film.
2) Thermostabilization of the upper layer, support layer according to the present invention, performed as specified in the technical enclosure 1.
3) Application of the formulation to modify the surface tension:
   The composition consists of:
1) water;
2) dichloroacetic acid;
3) silica.
   The composition is prepared as follows:
   In a 100-cm$^3$ flask with magnetic stir bar, 15 cm$^3$ of water, 10.5 g of dichloroacetic acid (70% in weight based on the quantity of solvent used) and 7.35 g of silica (70% in weight based on the quantity of solvent used) are poured. The flask is closed and stirred at room temperature. The composition is stirred for about 20-30 minutes, after which it is cooled to room temperature under stirring.
   The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 90° C.
5) Coupling of the upper polymer layer, support layer according to the present invention, with the lower layer, low-melting polyurethane layer according to the present invention, as specified in the technical enclosure 2.

Example 11

1) Polymer substrate used as upper layer, support layer according to the present invention: polyester film.
2) Thermostabilization of the upper layer, support layer according to the present invention, performed as specified in the technical enclosure 1.
3) Application of the formulation to modify the surface tension:
   The composition consists of:
1) water;
2) dichloroacetic acid;
3) silica.
   The composition is prepared as follows:
   In a 100-cm$^3$ flask with magnetic stir bar, 15 cm$^3$ of water, 10.5 g of dichloroacetic acid (70% in weight based on the quantity of solvent used) and 7.35 g of silica (70% in weight based on the quantity of solvent used) are poured. The flask is closed and stirred at room temperature. The composition is stirred for about 20-30 minutes, after which it is cooled to room temperature under stirring.
   The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 140° C.
5) Coupling of the upper polymer layer, support layer according to the present invention, with the lower layer, low-melting polyurethane layer according to the present invention, as specified in the technical enclosure 2.

Example 12

1) Polymer substrate used as upper layer, support layer according to the present invention: polycarbonate film.
2) Thermostabilization of the upper layer, support layer according to the present invention, performed as specified in the technical enclosure 1.
3) Application of the formulation to modify the surface tension:
   The composition consists of:
1) water;
2) dichloroacetic acid;
3) silica.
   The composition is prepared as follows:
   In a 100-cm$^3$ flask with magnetic stir bar, 15 cm$^3$ of water, 10.5 g of dichloroacetic acid (70% in weight based on the quantity of solvent used) and 7.35 g of silica (70% in weight based on the quantity of solvent used) are poured. The flask is closed and stirred at room temperature. The composition is stirred for about 20-30 minutes, after which it is cooled to room temperature under stirring.
   The composition is then applied at room temperature onto a surface of about 650 cm$^2$ of polymer film through mayer bar with LSB wire diameter of 0.100 mm; afterwards, the film is dried in an oven at 120° C. for 2 minutes. The procedure is repeated for both the polymer surfaces of the film.
4) Polymer substrate used as lower layer, low-melting polyurethane layer according to the present invention: polyurethane polymer film available on the market having a melting temperature of 140° C.
5) Coupling of the upper polymer layer, support layer according to the present invention, with the lower layer, low-melting polyurethane layer according to the present invention, as specified in the technical enclosure 2.

Example 13

1) Polymer substrate used as upper layer, support layer according to the present invention: polyetheroketone film.
2) Thermostabilization of the upper layer, support layer according to the present invention, performed as specified in the technical enclosure 1.
3) Application of the formulation to modify the surface tension:
   The composition consists of:
1) water;
2) dichloroacetic acid;
3) silica.
   The composition is prepared as follows:
   In a 100-cm$^3$ flask with magnetic stir bar, 15 cm$^3$ of water, 10.5 g of dichloroacetic acid (70% in weight based on the quantity of solvent used) and 7.35 g of silica (70% in weight based on the quantity of solvent used) are poured. The flask is closed and stirred at room temperature. The composition is stirred for about 20-30 minutes, after which it is cooled to room temperature under stirring.

The composition is then applied at room temperature onto a surface of about 650 cm² of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 100° C.

5) Coupling of the upper polymer layer, support layer according to the present invention, with the lower layer, low-melting polyurethane layer according to the present invention, as specified in the technical enclosure 2.

Example 14

1) Polymer substrate used as upper layer, support layer according to the present invention: polyetheroketone-polyetherosulfone film.

2) Thermostabilization of the upper layer, support layer according to the present invention, performed as specified in the technical enclosure 1.

3) Application of the formulation to modify the surface tension:
The composition consists of:
1) water;
2) dichloroacetic acid;
3) silica.

The composition is prepared as follows:
In a 100-cm³ flask with magnetic stir bar, 15 cm³ of water, 10.5 g of dichloroacetic acid (70% in weight based on the quantity of solvent used) and 7.35 g of silica (70% in weight based on the quantity of solvent used) are poured. The flask is closed and stirred at room temperature. The composition is stirred for about 20-30 minutes, after which it is cooled to room temperature under stirring.

The composition is then applied at room temperature onto a surface of about 650 cm² of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 110° C.

5) Coupling of the upper polymer layer, support layer according to the present invention, with the lower layer, low-melting polyurethane layer according to the present invention, as specified in the technical enclosure 2.

Example 15

1) Polymer substrate used as upper layer, support layer according to the present invention: polyacrylate-polycarbonate film.

2) Thermostabilization of the upper layer, support layer according to the present invention, performed as specified in the technical enclosure 1.

3) Application of the formulation to modify the surface tension:
The composition consists of:
1) water;
2) dichloroacetic acid;
3) silica.

The composition is prepared as follows:
In a 100-cm³ flask with magnetic stir bar, 15 cm³ of water, 10.5 g of dichloroacetic acid (70% in weight based on the quantity of solvent used) and 7.35 g of silica (70% in weight based on the quantity of solvent used) are poured. The flask is closed and stirred at room temperature. The composition is stirred for about 20-30 minutes, after which it is cooled to room temperature under stirring.

The composition is then applied at room temperature onto a surface of about 650 cm² of polymer film through mayer bar with LSB wire diameter of 0.100 mm; afterwards, the film is dried in an oven at 120° C. for 2 minutes. The procedure is repeated for both the polymer surfaces of the film.

4) Polymer substrate used as lower layer, low-melting polyurethane layer according to the present invention: polyurethane polymer film available on the market having a melting temperature of 120° C.

5) Coupling of the upper polymer layer, support layer according to the present invention, with the lower layer, low-melting polyurethane layer according to the present invention, as specified in the technical enclosure 2.

Technical enclosure 1: procedure for thermostabilizing the polymer film forming the upper layer, a support layer according to the present invention, of the suggested system.

Instruments: 1) Memmert laboratory oven; 2) Manual or digital optical scales.

Procedure: Using the optical scales, measure the sizes of both sides—long side and short side—of the polymer film; introduce the polymer sheet to be used for 40 seconds into the laboratory oven previously heated to 150° C. Take out the polymer sheet and wait for about 30 seconds until the material reverts to room temperature, then, using the optical scales, measure the sizes of the four sides of the polymer film. The polymer material is deemed as dimensionally stabilized if the dimensional variation measured before and after the thermal treatment, in particular in an oven, is less than 0.2% as a result of shrinking or elongation, the dimensional variation of the polymer film itself, namely the support layer according to the present invention, being applicable to both the measured sides.

Technical enclosure 2: procedure for thermally coupling the upper layer, the support layer according to the present invention, and the lower layer, the low-melting polyurethane layer according to the present invention, of the suggested double-layer system, the system having at least two layers according to the present invention.

Used instruments: Press matic vacuum press.

The upper polymer layer, the support layer according to the present invention, of the suggested system, a system with at least two layers according to the present invention, is coupled with the lower layer, a low-melting polyurethane layer according to the present invention, by overlapping the internal side of the upper polymer film, the support layer according to the present invention, to the internal side of the lower layer, a low-melting polyurethane layer according to the present invention, and submitting the above system to a estimated thermal pressure of 4-6 mbar and to a temperature not higher than the one used for thermostabilization (150° C.).

The invention claimed is:

1. System for transferring electrically conductive ink, adapted to receive and transfer said ink on a textile substrate, by thermal transfer, such system comprising:
a support layer containing a polymer thermostabilized at a temperature not greater than 150° C. and with a dimensional variation not greater than 0.2% when subjected to a thermal treatment in an oven at 150° C. for 40 seconds and at room temperature for approximately 30 seconds,
a low-melting polyurethane layer, having a melting temperature not greater than 150° C., and
a system activating the surfaces of the support layer, said activating system comprising an activating agent which is at least: trichloroacetic acid (TCA) and/or dichloroacetic acid (DCA), wherein said system activating the surfaces of the support layer, is interposed between the support layer and the low-melting polyurethane layer and is applied on the outer surface of the support layer adapted to receive the ink, promoting the adherence and engagement of the conductive ink which is to be printed thereon,
wherein the low-melting polyurethane film, after heating, allows the electrically conductive ink applied above the polyurethane film through the support layer to adhere to the textile substrate.

2. System for transferring ink according to claim 1, further comprising, in combination with the activating agent, silicon inorganic compounds are selected among the families of talcs, wollastonite, silica, montmorillonites and kaolins, or combinations thereof.

3. System for transferring ink according to claim 1, wherein the polymer thermostabilized at a temperature not greater than 150° C. and with a dimensional variation not greater than 0.2% when subjected to a thermal treatment in an oven at 150° C. for 40 seconds and at room temperature for approximately 30 seconds, is selected among the families of polyetheroketones, polyetherosulfones, sulfonated polyetherosulfones, polyacrylates, polymetacrylates, polyesters, polyethers, polycarbonates and among the families of the compounds of polyetheroketones and polyetherosulfones, compounds of polyetheroketones and sulfonated polyetherosulfones, compounds of polyetherosulfones and sulfonated polyetherosulfones, compounds of polyacrylates and polymetacrylates, compounds of polyacrylates and polyesters, compounds of polymetacrylates and polyesters, compounds of polyacrylates and polyethers, compounds of polymetacrylates and polyethers, compounds polyesters and polycarbonates.

4. System for transferring ink according to claim 3, wherein the polymer belongs to the family of polyesters, particularly, is polyethyleneterephtalate.

* * * * *